(12) United States Patent
Sunaga et al.

(10) Patent No.: US 8,445,621 B2
(45) Date of Patent: May 21, 2013

(54) POLYIMIDE RESIN AND PHOTOSENSITIVE POLYIMIDE RESIN COMPOSITION

(75) Inventors: Tomoyasu Sunaga, Tochigi (JP); Hiroki Kanaya, Tochigi (JP); Mamiko Nomura, Tochigi (JP); Junichi Ishii, Tochigi (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 472 days.

(21) Appl. No.: 12/670,965

(22) PCT Filed: Aug. 20, 2008

(86) PCT No.: PCT/JP2008/064794
§ 371 (c)(1),
(2), (4) Date: Jan. 27, 2010

(87) PCT Pub. No.: WO2009/025283
PCT Pub. Date: Feb. 26, 2009

(65) Prior Publication Data
US 2010/0187001 A1 Jul. 29, 2010

(30) Foreign Application Priority Data
Aug. 22, 2007 (JP) ................................. 2007-216203

(51) Int. Cl.
*C08G 77/26* (2006.01)
(52) U.S. Cl.
USPC ............................................. 528/38; 528/26
(58) Field of Classification Search
USPC .................................................... 528/38, 26
See application file for complete search history.

(56) References Cited

U.S. PATENT DOCUMENTS

| | | | |
|---|---|---|---|
| 4,139,547 A | 2/1979 | Berger | |
| 4,395,527 A | 7/1983 | Berger | |
| 4,480,009 A | 10/1984 | Berger | |
| 4,499,149 A | 2/1985 | Berger | |
| 6,077,924 A | 6/2000 | Chiang et al. | |
| 2002/0016438 A1 | 2/2002 | Sugo et al. | |
| 2006/0159839 A1* | 7/2006 | Suwa | 427/66 |
| 2008/0090927 A1 | 4/2008 | Ishii et al. | |

FOREIGN PATENT DOCUMENTS

| | | |
|---|---|---|
| JP | A-57-123223 | 7/1982 |
| JP | A-2000-75478 | 3/2000 |
| JP | A-2002-12666 | 1/2002 |
| JP | B2-3363600 | 1/2003 |
| JP | A-2003-131371 | 5/2003 |
| JP | A-2006-83307 | 3/2006 |
| JP | A-2006-206756 | 8/2006 |
| WO | WO 2008/096601 A1 | 8/2008 |

OTHER PUBLICATIONS

JP 2002 012666 Machine translation (2002).*
Chinese Office Action issued in Application No. 200880103968.X; Dated Jun. 22, 2011 (With Translation).
Dec. 18, 2009 International Preliminary Report on Patentability issued in corresponding International Patent Application No. PCT/JP2008/064794 (with translation).
Written Opinion of the International Searching Authority issued in International Application No. PCT/JP2008/064794 on Nov. 4, 2008 (with partial translation).
"Hitachi Chemical Technical Report;" Jul. 2007; No. 39; Hitachi Chemical Co., Ltd. (with partial translation).
Pine; *Organic Chemistry*; 1987; pp. 283 and 642; Fifth Edition.
"Development & High Function Conferring Technology of New Polyimides for Next-Generation Electronics and Electronic Materials;" Technical Information Institute; 2003; pp. 42 (with partial translation).
International Search Report mailed on Nov. 4, 2008 in corresponding International Application No. PCT/JP2008/064794 (with translation).
Aug. 24, 2012 Office Action cited in Application No. 097131881 (with English Translation).
Chinese Second Office Action issued in Application No. 200880103968.X; Dated Apr. 19, 2012 (With Translation).

* cited by examiner

*Primary Examiner* — Kuo-Liang Peng
(74) *Attorney, Agent, or Firm* — Oliff & Berridge, PLC

(57) ABSTRACT

A novel polyimide resin is formed by imidizing a diamine component including an amide group-containing siloxane diamine compound represented by the following formula (1) and an acid dianhydride component including an aromatic acid dianhydride such as 3,3',4,4'-diphenylsulfone tetracarboxylic dianhydride. This novel polyimide resin utilizes a novel polyimide resin into which a reaction group capable of reacting with a crosslinking agent to form a crosslinking point is pre-introduced before imidization. The novel polyimide resin can confer a comparatively low elastic modulus and heat resistance to a dry film or a photosensitive cover film formed from a photosensitive polyimide resin composition containing the novel polyimide resin.

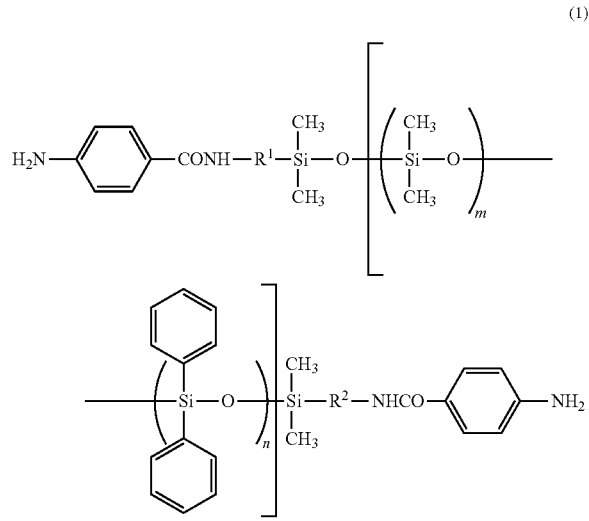

In the formula (1), $R^1$ and $R^2$ are each independently an optionally-substituted alkylene group, m denotes an integer of 1 to 30, and n denotes an integer of 0 to 20.

5 Claims, No Drawings

POLYIMIDE RESIN AND PHOTOSENSITIVE POLYIMIDE RESIN COMPOSITION

TECHNICAL FIELD

The present invention relates to a novel polyimide resin and a photosensitive polyimide resin composition containing such novel polyimide resin.

BACKGROUND ART

When producing a flexible printed wiring board or a rigid wiring board, a liquid resist or, a dry film formed from a resin composition on a copper clad laminate as a base, and a polyimide film provided with an adhesive are commonly used as a cover material. Furthermore, a photosensitive resin composition (liquid photosensitive resist) and a photosensitive dry film which are photosensitive are also used as a photosensitive cover film. Examples of the constituent materials of these include polybenzimidazole resins, polybenzoxazole resins, and polyimide resins which have excellent heat resistance. However, in terms of ease of resin production and production cost, polyimide resins especially are very useful.

However, flexible printed wiring boards and rigid wiring boards have a laminate structure of organic and inorganic materials. Depending on the materials constituting the laminate, warping of the substrate can occur. Warping can be expressed by the following formula based on the physical properties of the respective constituent materials. Therefore, while there are several approaches, considering the case of a polyimide type cover material, these wiring boards can be prevented from warping by reducing the elastic modulus of the film itself which is made of the polyimide resin. To cope with such a demand, it has been proposed to use a siloxane diamine as one of the plurality of diamine components constituting the polyimide resin (Patent Document 1). Furthermore, it is also required to improve the film-forming properties and chemical resistance of the polyimide resin which uses such a siloxane diamine. To meet these demands, a vinyl ether residue is introduced into the polyimide resin as a reaction group which reacts with an acrylate serving as a crosslinking agent to form a crosslinking point.

$$(\text{Warping}) = \int_{T_{cure}}^{T_0} \frac{E_f}{1-v_f}(\alpha_f - \alpha_s) dT$$

$T_{cure}$: Temperature applied on the laminate
$E_f$: Elastic modulus of material
$\alpha_f$: Coefficient of thermal expansion of material
$\alpha_s$: Coefficient of thermal expansion of substrate
$v_f$: Constant
[Patent Document 1] Japanese Patent Application Laid-Open. No. 2003-131371

DISCLOSURE OF THE INVENTION

Problems to be Solved by the Invention

However, although the intended low elastic modulus can be conferred to a film formed from a polyimide resin prepared using a siloxane diamine like that described in Patent Document 1, there is the problem that electroless Ni/Au plating resistance deteriorates. Furthermore, the vinyl ether residue is introduced into a polyimide resin produced by reacting a siloxane diamine with an acid dianhydride to form a polyimide, and then isolating to obtain the polyimide resin. Therefore, this cannot be said to be an advantageous introduction method in terms of industrial productivity. In addition, it is preferred to confer flame retardance to polyimide resins which are used in electronic parts.

The present invention is directed to solving the above-described problems in the conventional art. It is an object of the present invention to enable a comparatively low elastic modulus, good electroless plating resistance, and good flame retardance to be conferred to a film formed from a polyimide resin. Further, it is also an object of the present invention to enable a reaction group for forming a crosslinking point, which serves as a site where a reaction with a crosslinking agent occurs, to be pre-introduced into a polyimide resin.

Means for Solving the Problems

The present inventors discovered that the above-described objects can be achieved by using, as a siloxane diamine, which is one of the diamine components constituting a polyimide resin, a novel amide group-containing siloxane diamine compound with a specific structure having an amide group capable of reacting with a crosslinking agent such as an epoxy-containing compound to form a crosslinking point in the molecule, thereby completing the present invention.

More specifically, the present invention provides a polyimide resin formed by imidization of a diamine component which includes a novel amide group-containing siloxane diamine compound represented by the following formula (1), and an acid dianhydride component which includes at least one kind of aromatic acid dianhydride selected from the group consisting of a pyromellitic tetracarboxylic dianhydride, 3,3',4,4'-benzophenone tetracarboxylic dianhydride, 3,3',4,4'-diphenyl ether tetracarboxylic dianhydride, 3,3',4,4'-diphenylsulfone tetracarboxylic dianhydride, 2,2'-bis(3,4-dicarboxyphenyl)propanoic dianhydride, 1,4,5,8-naphthalene tetracarboxylic dianhydride, 4,4'-(hexafluoro-isopropylidene)diphthalic dianhydride, 9,9-bis(3,4-dicarboxyphenyl)fluorene dianhydride, 9,9-bis[4-(3,4-dicarboxyphenoxy)phenyl]fluorene dianhydride, and 1,2,3,4-cyclobutanoic dianhydride.

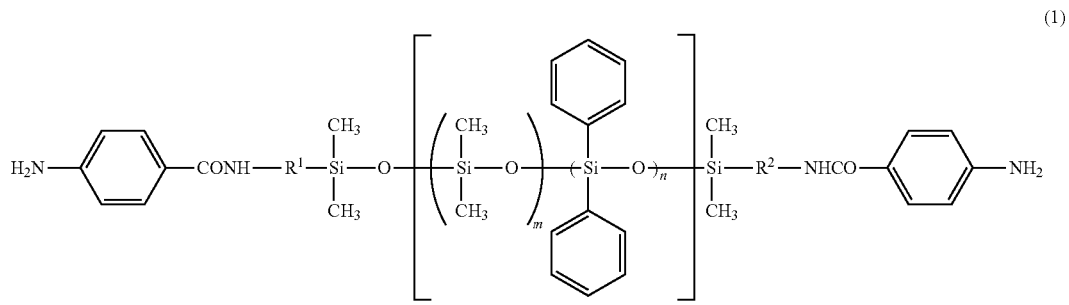

(1)

In the formula (1), $R^1$ and $R^2$ are each independently an alkylene group which may be substituted, m denotes an integer of 1 to 30, and n denotes an integer of 0 to 20.

Furthermore, the present invention provides a polyimide resin composition including the above-described novel polyimide resin and a photosensitizing agent.

In addition, the present invention provides a wiring board having a polyimide resin layer, the polyimide resin layer being a film of the above-described photosensitive polyimide resin composition.

Advantages of the Invention

In the novel polyimide resin according to the present invention, the novel amide group-containing siloxane diamine compound having a siloxane unit is an essential diamine component, which allows the elastic modulus of the polyimide resin to be reduced. Furthermore, because the novel amide group-containing siloxane diamine compound has an amide bond in the molecule, adhesion of the polyimide resin to a conductor part, such as copper on the wiring board, can be improved. In addition, the amide group forms a crosslinking point by an addition reaction or an insertion reaction with an epoxy group. This means that an operation for introducing a reaction group for forming a crosslinking point to act as a site where the reaction with the crosslinking agent occurs after isolating the polyimide resin becomes unnecessary. A photosensitive polyimide resin composition including such a novel polyimide resin can confer a comparatively low elastic modulus and good electroless plating resistance to a film which is formed from this photosensitive polyimide resin composition. Therefore, a wiring board produced utilizing the photosensitive polyimide resin composition does not warp much even if it is a flexible board. Furthermore, rising of the ends of the polyimide resin composition layer due to the plating can be suppressed. Moreover, flame retardance is excellent, as there are many aromatic rings in the molecule.

BEST MODE FOR CARRYING OUT THE INVENTION

The novel polyimide resin according to the present invention is formed by imidization of a diamine component which includes an amide group-containing siloxane diamine compound represented by the following formula (1), and an acid dianhydride component which includes at least one kind of aromatic acid dianhydride selected from the group consisting of a pyromellitic tetracarboxylic dianhydride, 3,3',4,4'-benzophenone tetracarboxylic dianhydride, 3,3',4,4'-diphenyl ether tetracarboxylic dianhydride, 3,3',4,4'-diphenylsulfone tetracarboxylic dianhydride, 2,2'-bis(3,4-dicarboxyphenyl)propanoic dianhydride, 1,4,5,8-naphthalene tetracarboxylic dianhydride, 4,4'-(hexafluoro-isopropylidene)diphthalic dianhydride, 9,9-bis(3,4-dicarboxyphenyl)fluorene dianhydride, 9,9-bis[4-(3,4-dicarboxyphenoxy)phenyl]fluorene dianhydride, and 1,2,3,4-cyclobutanoic dianhydride.

The novel amide group-containing siloxane diamine compound, which is an essential diamine component of the novel polyimide resin according to the present invention, has a chemical structure represented by the formula (1).

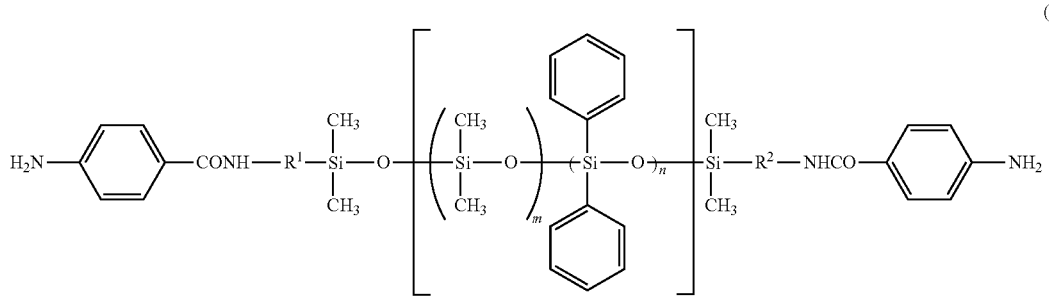

(1)

In the formula (1), $R^1$ and $R^2$ are each independently an alkylene group which may be substituted. Specific examples thereof include a methylene group, an ethylene group, a trimethylene group, a tetramethylene group, a pentamethylene group, and a hexamethylene group. Examples of substituents include a lower alkyl group such as a methyl group or an ethyl group, and an aryl group such as a phenyl group. Among these, a trimethylene group is preferred as the raw materials are easily available. Furthermore, while $R^1$ and $R^2$ may be the same or different, it is preferred that $R^1$ and $R^2$ are the same, as this avoids difficulty in obtaining the raw materials.

Furthermore, although m denotes an integer of 1 to 30, m is preferably an integer of 1 to 20, and more preferably an integer of 2 to 20. This is because if m is 0, it is difficult to obtain the raw materials, while if m is more than 30, the compound does not mix in the reaction solvent and remains separated. On the other hand, although n denotes an integer of 0 to 20, n is preferably an integer of 1 to 20, and more preferably an integer of 1 to 10. This is because if n is 1 or more, a diphenyl siloxane unit having excellent flame retardance is introduced, so that the resultant compound has better flame retardance than when such a unit is not introduced. In addition, if n is more than 20, the contribution to a lower elasticity is reduced.

Although the number average molecular weight of the novel amide group-containing siloxane diamine compound of the formula (1) varies depending on the values of m and n, this number average molecular weight is preferably 500 to 3,000, and more preferably 1,000 to 2,000.

The novel amide group-containing siloxane diamine compound of the formula (1) has an amide bond at either end of the molecule. Thus, the polyimide resin prepared from the amide group-containing siloxane diamine compound will also continue to have the amide bonds. Therefore, the adhesion between a polyimide resin derived from the novel amide group-containing siloxane diamine compound of the present invention and a conductor part, such as copper on the wiring board, improves. In addition, amide groups are known to undergo an addition reaction or insertion reaction with an epoxy group (Hitachi Chemical Technical Report, No. 39 (2002-7), page 29). Therefore, if an epoxy resin commonly used in resin compositions or dry films is combined with the polyimide resin derived from the novel amide group-containing siloxane diamine compound according to the present invention, the amide group functions as a reaction group for forming a crosslinking point that acts as a site where the reaction with the crosslinking agent occurs. Consequently, a process for introducing a crosslinking group after isolating the polyimide resin is unnecessary.

The novel amide group-containing siloxane diamine compound represented by the formula (1) can be produced according to the following reaction scheme.

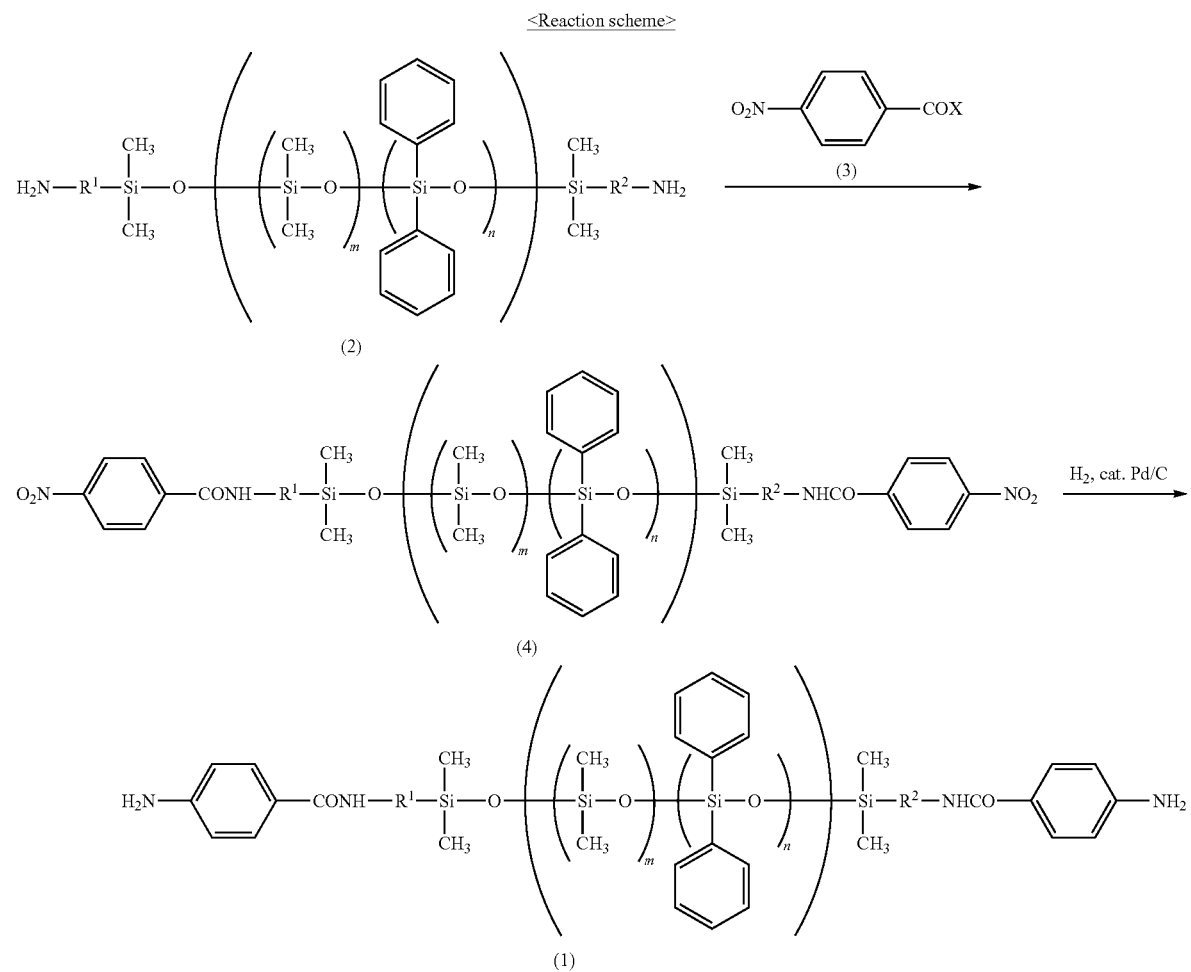

In the formulae (1) to (4), $R^1$, $R^2$, m, and n are as already described for the formula (1), and X represents a halogen atom such as chlorine or bromine.

In the method for producing the novel amide group-containing siloxane diamine compound represented by the formula (1), first, the amide group-containing dinitro compound represented by f the formula (4) is formed by subjecting a diamine compound represented by the formula (2) and a nitrobenzoyl halide represented by the formula (3) to a nucleophilic substitution reaction. In this case, for example, the dinitro compound represented by the formula (4) can be formed by heating and mixing the compound represented by the formula (2) and the compound represented by the formula (3) in a solvent such as toluene in the presence of a base such as triethylamine (see Organic Chemistry, Fifth Edition, page 283 (Ed. Stanley H. Pine)).

Next, the nitro group of the dinitro compound represented by the formula (4) is reduced to an amino group, whereby the novel amide group-containing siloxane diamine compound represented by the formula (1) is obtained. The reduction method is not especially limited, as long as the compound represented by the formula (1) can be obtained by converting the nitro groups into amino groups. Examples of the reduction method may include contacting the compound represented by the formula (4) with excess hydrogen in the presence of a palladium-carbon catalyst, in a mixed solvent of ethyl benzoate and ethanol, for example (see Organic Chemistry, Fifth Edition, page 642 (Ed. Stanley H. Pine)).

If the amount of the amide group-containing siloxane diamine compound represented by the formula (1) in the diamine component constituting the polyimide resin according to the present invention is too small, electroless plating resistance deteriorates. On the other hand, if this amount is too large, warping increases. Therefore, the amount is preferably 0.1 to 20 mol %, and more preferably 0.1 to 15 mol %.

To reduce warping, the diamine component may also include, in addition to the amide group-containing siloxane diamine compound represented by the formula (1) which is an essential component, a siloxane diamine compound represented by the formula (2). If the amount of the siloxane diamine compound represented by the formula (2) is too small, the effect of reducing warping is insufficient. On the other hand, if the amount is too large, flame retardance deteriorates. Therefore, the amount is preferably 40 to 90 mol %, and more preferably 50 to 80 mol %. Furthermore, to achieve alkali solubility, which is the basis for conferring positive-type photosensitivity, the diamine component may also contain 3,3'-diamino-4,4'-dihydroxydiphenylsulfone in addition to the diamine compounds represented by the formulae (1) and (2). If the amount of the 3,3'-diamino-4,4'-dihydroxydiphenylsulfone in the diamine component is too small, alkali solubility cannot be obtained. On the other hand, if the amount is too large, alkali solubility is too high. Therefore, the amount is preferably 20 to 50 mol %, and more preferably 25 to 45 mol %.

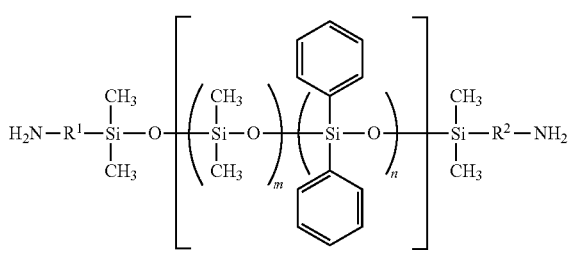

(2)

In the formula (2), $R^1$, $R^2$, m, and n are as described for the formula (1).

As the diamine component, to the extent that the advantageous effects of the present invention are not harmed, the diamine compound represented by the formula (2) and the 3,3'-diamino-4,4'-dihydroxydiphenylsulfone may be combined with a similar diamine compound to that used as the diamine component for a typical polyimide resin (see Japanese Patent No. 3363600, paragraph 0008).

Examples of the acid dianhydride component constituting the novel polyimide resin according to the present invention include dianhydride components which include at least one kind of aromatic acid dianhydride selected from the group consisting of a pyromellitic tetracarboxylic dianhydride, 3,3',4,4'-benzophenone tetracarboxylic dianhydride, 3,3',4,4'-diphenyl ether tetracarboxylic dianhydride, 3,3',4,4'-diphenylsulfone tetracarboxylic dianhydride, 2,2'-bis(3,4-dicarboxyphenyl)propanoic dianhydride, 1,4,5,8-naphthalene tetracarboxylic dianhydride, 4,4'-(hexafluoroisopropylidene)diphthalic dianhydride, 9,9-bis(3,4-dicarboxyphenyl)fluorene dianhydride, 9,9-bis[4-(3,4-dicarboxyphenoxy)phenyl]fluorene dianhydride, and 1,2,3,4-cyclobutanoic dianhydride. Among these, from the perspective of alkali solubility, which is the basis for conferring positive-type photosensitivity, it is preferred to use 3,3',4,4'-diphenylsulfone tetracarboxylic dianhydride.

As the dianhydride component, to the extent that the advantageous effects of the present invention are not harmed, the above-described compounds may be combined with a similar dianhydride to that used as the dianhydride component for a typical polyimide resin (see Japanese Patent No. 3363600, paragraph 0009).

The polyimide resin according to the present invention can be produced by imidization of the above-described diamine component, which includes an amide group-containing siloxane diamine compound represented by the formula (1), and the acid dianhydride component. The molar ratio of the dianhydride component with respect to 1 mol of the diamine component is, usually, 0.8 to 1.2, and preferably 0.9 to 1.1. Furthermore, to protect the molecule ends of the polyimide resin, a dicarboxylic anhydride and a monoamine compound may optionally be made to coexist during the imidization (see Japanese Patent No. 3363600, paragraph 0011).

The imidization conditions may be appropriately selected from among known imidization conditions. In this case, also included are the conditions for forming an intermediary such as polyamic acid, and then imidizing. For example, the imidization can be carried out with known solution imidization conditions, thermal imidization conditions, and chemical imidization conditions (Development & High Function Conferring Technology of New Polyimides For Next-Generation Electronics and Electronic Materials, Technical Information Institute, 2003, p. 42).

A preferred embodiment of the above-described polyimide resin according to the present invention includes a polyimide resin represented by the following structural formula (a) as an essential component. Moreover, it is preferred to further include a polyimide resin represented by the following structural formulae (b) and (c).

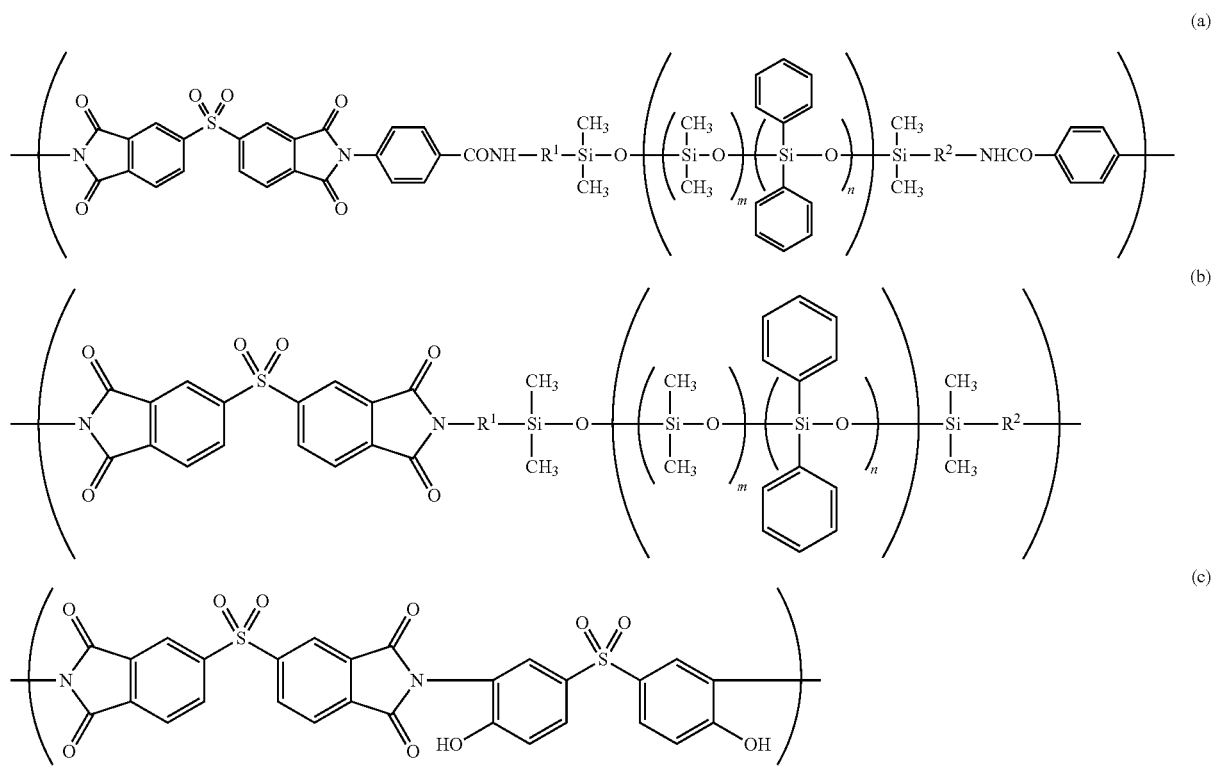

The photosensitive polyimide resin composition according to the present invention includes the above-described polyimide resin and a photosensitizing agent. By including this photosensitizing agent, photosensitivity can be conferred to the polyimide composition to be formed. Examples of this photosensitizing agent include a diazonaphthoquinone compound. The alkali solubility of a polyimide composition including this diazonaphthoquinone compound changes from exposure to light. Before exposure to light, solubility in an aqueous alkali solution is low. However, after exposure to light, the molecular structure of the diazonaphthoquinone compound changes to form a ketene. This ketene reacts with the aqueous alkali solution to produce a carboxylic acid. The produced carboxylic acid further reacts with water and dissolves. Consequently, by irradiating light, solubility in the aqueous alkali solution increases.

By including the photosensitizing agent diazonaphthoquinone compound, in the polyimide composition including a polyimide having a hydroxyl group, the diazonaphthoquinone compound interacts with the hydroxyl group. Consequently, the hydroxyl group, which tends to dissolve in an alkali, is protected, and alkali solubility decreases. If the polyimide composition is exposed to light in this state, the molecular structure of the diazonaphthoquinone compound changes, and alkali solubility is manifested. Therefore, by including the diazonaphthoquinone compound as a photosensitizing agent, a pattern can be formed by exposing the wiring board to light and then developing with an aqueous alkali solution such as sodium hydroxide, tetramethylammonium hydroxide and the like.

Examples of the photosensitizing agent diazonaphthoquinone compound include 2,3,4-trihydroxybenzophenone o-naphthoquinonediazido-4-sulfonate, 2,3,4-trihydroxybenzophenone o-naphthoquinonediazido-5-sulfonate, and 2,3,4-trihydroxybenzophenone o-benzoquinonediazido-4-sulfonate. However, the diazonaphthoquinone compound is not limited to these examples, as long as the compound has a diazonaphthoquinone skeleton.

In the photosensitive polyimide resin composition according to the present invention, the blended amount of the photosensitizing agent is preferably 5 to 30 parts by mass based on 100 parts by mass of the polyimide resin.

The photosensitive polyimide resin composition according to the present invention can include a metal deactivator. Examples of this metal deactivator include 2,3-bis[3-(3,5-di-tert-butyl-4-hydroxyphenyl)propionyl]propionohydrazide (CDA-10, ADEKA Corporation) being a hydrazide type metal diactivator. When used in the wiring board, the metal deactivator can prevent the resin in the polyimide composition in contact with the metal from deteriorating.

Examples of the metal deactivator other than CDA-10 include, but are not limited to: as hydrazide deactivators, decamethylene carboxylic acid disalicyloyl hydrazide; and as triazole deactivators, 3-(N-salicyloyl)amino-1,2,4-triazole and the like.

The photosensitive polyimide resin composition according to the present invention can improve adhesion between the conductor part, such as copper foil, and the polyimide resin. To improve plating resistance, the photosensitive polyimide resin composition may include a crosslinking agent. The crosslinking agent reacts with amide groups in the polyimide resin, or the crosslinking agent reacts with itself, to form a three-dimensional crosslinked structure. Crosslinking agents conventionally used in resins for electronic parts can be used as such a crosslinking agent. From the perspective of reactivity, preferred examples of the crosslinking agent include epoxy crosslinking agents and oxazine crosslinking agents.

The epoxy crosslinking agent preferably exhibits good compatibility with the polyimide resin, and may be various epoxy monomers, oligomers, and polymers conventionally used for epoxy resin formation. Specific examples thereof include: alicyclic epoxy compounds such as bis-F epoxy compounds, bis-A epoxy compounds, and 3,4-epoxycyclohexenylmethyl-3',4-epoxycyclohexene carboxylate; glycidyl ether compounds such as sorbitol polyglycidyl ether, polyglycerol polyglycidyl ether, pentaerythritol polyglycidyl ether, diglyceryl polyglycidyl ether, glycerol polyglycidyl ether, polymethylol propane polyglycidyl ether, resorcinol diglyceryl ether, neopentyl glycol diglycidyl ether, 1,6-hexanediol diglycidyl ether, hydrogenated bisphenol A diglycidyl ether, polyethylene glycol glycidyl ether, polypropylene glycol glycidyl ether, and hydroquinone diglycidyl ether; glycidyl esters such as diglycidyl phthalate and glycidyl terephthalate; halogenated fire retardant epoxy compounds such as dibromoneopentyl glycol glycidyl ether; novolac epoxy resins such as cresol novolac epoxy resin and phenol novolac epoxy resin; and glycidyl amine compounds such as tetraglycidyl diaminodiphenylmethane, tetraglycidyl meta-xylenediamine, triglycidyl aminophenol, and diglycidyl aniline.

Furthermore, as the oxazine crosslinking agent, an oxazine crosslinking agent which originally is utilized as a thermosetting monomer which carries out ring opening polymerization with heat can be used. Examples thereof include bisphenol F benzoxazines (for example, 6,6'-(1-methylidene)bis[3,4-dihydro-3-phenyl-2H-1,3-benzoxazine] etc.), bisphenol S benzoxazines (for example, 6,6'-sulfonylbis[3,4-dihydro-3-phenyl-2H-1,3-benzoxazine] etc.), bisphenol A benzoxazines (below formula (d), phenol novolac benzoxazines (below formula (e)) and the like.

The photosensitive polyimide resin composition according to the present invention may optionally contain an additive, such as a solvent, a filler, a pigment and the like.

The photosensitive polyimide resin composition according to the present invention can be prepared by uniformly mixing by an ordinary method a photosensitizing agent, and optionally a metal deactivator, a crosslinking agent, and other further additives with the polyimide resin of the present invention.

The photosensitive polyimide resin composition according to the present invention can be preferably applied as the polyimide resin of a wiring board having a polyimide resin layer. A thus-configured wiring board is also within the scope of the present invention. As the application method, a known technique may be employed. Examples of the polyimide resin layer may include, from a functional perspective, a dry film resist layer and a cover film layer. The polyimide resin layer can also be used as an interlayer dielectric film.

An example of a specific application method will now be described below. Specifically, the photosensitive polyimide resin composition according to the present invention is coated by a known coating method on the copper of a copper clad laminate. The coated resin composition is then dried to form a photosensitive polyimide resin composition layer. This photosensitive polyimide resin composition layer is exposed with light by, for example, an ultrahigh pressure mercury lamp (including three lines of g, h, and i lines) via a mask. Next, the exposed resin composition layer is developed by an aqueous alkaline solution such as aqueous sodium hydroxide or aqueous tetramethylammonium hydroxide. The resultant wiring board on which a pattern was formed by the developing is post-baked at 200° C., for example. The wiring board may optionally be dipped in an electroless nickel plating solution, and then dipped in an electroless gold plating solution to form a plating layer on the copper so that the wiring board is manufactured. The thus-produced wiring board has a poly-

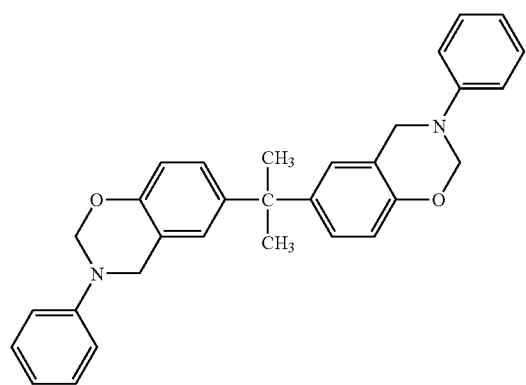

(d)

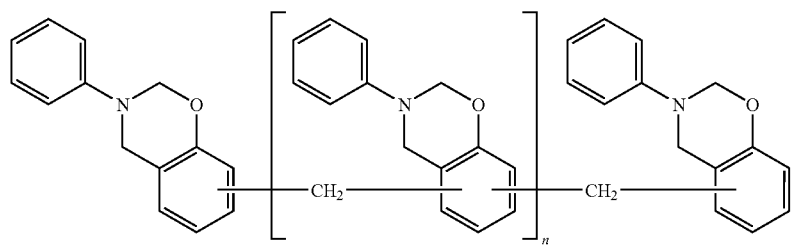

(e)

imide resin composition layer, which has as a main component a novel polyimide resin including a diamine component and an acid dianhydride. This layer exhibits a comparatively low elastic modulus, good electroless plating resistance, and good heat resistance. Therefore, a wiring board produced utilizing the photosensitive polyimide resin composition does not warp much even if it is a flexible board. Furthermore, discoloration of the conductor and rising of the ends of the polyimide resin composition layer due to the plating can be suppressed, and flame retardance is excellent.

EXAMPLES

First, a production example of the novel amide group-containing siloxane diamine compound represented by the formula (1) will be described in the following Reference Example 1. Then, polymerization examples of a polyimide compound will be described in Polymerization Examples 1 to 5. After that, the examples and comparative examples of the present invention will be described in detail and compared. Tables 1 and 2 show the composition and values of the dicarboxylic acid component and the diamine component of the polyimide compound according to Polymerization Examples 1 to 5. These values represent the number of moles of the respective components (i.e., DSDA, X-22-9409, BSDA, and the siloxane diamine of Reference Example 1) when the total of all the diamine components (X-22-9409, BSDA, and the siloxane diamine of Reference Example 1) is calculated as 100. However, in Comparative Example 1, because a siloxane diamine of Reference Example 1 is not used, the sum of all the diamine components was calculated from total of the X-22-9409 and the BSDA.

Reference Example 1

A 2 L reaction vessel equipped with a cooling device, a thermometer, a dropping funnel, and a stirring device was charged with 500 g of toluene, 200 g (0.148 mmol) of the siloxane diamine of the formula (2) ($R^1$ and $R^2$=trimethylene; Trade name: X-22-9409, Shin-Etsu Chemical Co. Ltd.), and 30 g (0.297 mol) of triethylamine. Then, a solution produced by dissolving 54.7 g (0.295 mol) of p-nitrobenzoyl chloride in 300 g of toluene was added dropwise into the dropping funnel. While stirring the contents of the reaction vessel, the temperature was increased to 50° C., and then the solution in the dropping funnel was added dropwise over 1 hour. After the dropping was finished, the temperature was increased, the mixture was stirred for 6 hours, and reacted under reflux. After the reaction finished, the temperature was reduced to 30° C. The mixture was then charged with 800 g of water and strongly stirred. The mixture was transferred to a separatory funnel, and left to stand to separate. The thus-separated mixture was washed three times with 300 g of 5% aqueous sodium hydroxide solution, then washed twice with 300 g of saturated aqueous sodium chloride solution. The organic layer was dried over magnesium sulfate, and concentrated by removing the toluene solvent by distillation under heat and reduced pressure. The resultant product was dried at 60° C. under reduced pressure for 1 day to obtain α-(p-nitrobenzoyliminopropyldimethylsiloxy)-ω-(p-nitrobenzoyliminopropyldimethylsilyl)oligo(dimethylsiloxane-co-diphenylsiloxane) (hereinafter, "dinitro product") in a yield of 235 g (96% yield). The dinitro product was a pale yellow oil.

112 g (0.068 mol) of the obtained dinitro product was charged into a 1 L reaction vessel equipped with a stirrer, a hydrogen feed pipe, and a hydrogen sphere, along with 180 g of ethyl acetate, 320 g of ethanol, and 20 g (water content 50%) of 2% palladium-carbon. The contents of the reaction vessel were purged to form a hydrogen atmosphere, and then the mixture was stirred for 2 days under hydrogen sphere pressure. The catalyst was removed from the reaction mixture by filtration. The resultant reaction solution was concentrated by heating under reduced pressure, and then dried under reduced pressure at 60° C. for 2 days, whereby α-(p-aminobenzoyliminopropyldimethylsiloxy)-ω-(aminobenzoyliminopropyldimethylsilyl)oligo(dimethylsiloxane-co-diphenylsiloxane) (the novel amide group-containing siloxane diamine compound used in the present invention) was obtained as a pale yellow oil in a yield of 102 g (95% yield). The amine value of the obtained novel amide group-containing siloxane diamine compound was 69.96 KOH mg/g, and the amino group equivalent was 802 g/mol. The amine value was measured using an automatic potentiometric titrator (AT-500, manufactured by Kyoto Electronics & Manufacturing Co., Ltd.). The amino group equivalent was calculated based on 56.106/(amine value)×1000.

Furthermore, the infrared absorption spectrum and $^1$H-NMR spectrum of the obtained novel amide group-containing siloxane diamine compound were measured. As a result, it was confirmed that the intended product was obtained. The infrared absorption spectrum was measured by a transmission method using a Fourier transform infrared spectrometer (FT-IR420, manufactured by Jasco Corporation). The $^1$H-NMR spectrum was measured in heavy chloroform using an NMR spectrometer (Mercury VX-300, Varian Technologies Japan Limited).

These results are shown below.

IR spectrum: 3450 cm$^{-1}$ ($v_{N-H}$), 3370 cm$^{-1}$ ($v_{N-H}$), 3340 cm$^{-1}$ ($v_{N-H}$), 3222 cm$^{-1}$, ($v_{N-H}$), 1623 cm$^{-1}$ ($v_{C=O}$) 1260 cm$^{-1}$ ($v_{CH3}$), 1000-1100 cm$^{-1}$ ($v_{Si-O}$)

$^1$H-NMR (CDCl$_3$, δ): −0.2-0.2 (m, methyl), 0.4-0.6 (m, 4H, methylene), 1.4-1.8 (m, 4H, methylene), 3.2-3.5 (m, 4H, methylene), 3.9 (bs, 4H, hydrogen atoms of amino group), 5.8-6.3 (m, 2H, hydrogen atoms of amide group), 6.4 (m, 4H, aromatic hydrogen atoms adjacent to amino group), 7.1-7.7 (m, aromatic hydrogen atoms)

Polymerization Example 1

Example Containing 1 mol % of the Novel Amide Group-Containing Siloxane Diamine Compound of the Formula (1) in the Total Diamine Components A 20 L reaction container equipped with a nitrogen feed pipe, a stirring device, and a Dean-Stark trap was charged with a mixed solution of 4,460.6 g (3.30 mol) of a siloxane diamine compound (X-22-9409, Shin-Etsu Chemical Co. Ltd.), 1,912.7 g (5.34 mol) of 3,3',4,4'-diphenylsulfone tetracarboxylic dianhydride (DSDA, New Japan Chemical Co., Ltd., 99.70% purity), 287 g of γ-butyrolactone, and 89.0 g (54.3 mmol, 97.10% purity) of the novel amide group-containing siloxane diamine compound obtained in Reference Example 1, and with 2,870 g of triglyme. The resultant mixture was stirred, charged with a further 1,100 g of toluene, and then heated to reflux for 2 hours at 185° C. Then, reduced-pressure dewatering and toluene removal were carried out to obtain a solution of an acid anhydride with oligo-imide ends.

The obtained solution of the acid anhydride with oligo-imide ends was cooled to 80° C., and then charged with a dispersion including 3,431 g of triglyme, 413 g of γ-butyrolactone, and 537.80 g (1.92 mol) of 3,3'-diamino-4,4'-dihydroxydiphenylsulfone (BSDA, Konishi Chemical Ind. Co., Ltd., 99.70% purity). The resultant mixture was stirred for 2 hours at 80° C., then charged with 524 g of triglyme to adjust a solvent amount. The solution was then heated to reflux for 2 hours at 185° C. The resultant reaction mixture was cooled to room temperature, and the toluene and water which had accumulated in the trap were removed. From these operations, a novel polyimide compound having an amide group was synthesized. The actually-measured solid content of the obtained polyimide was 47.5%. Furthermore, the molecular weight in terms of polystyrene by GPC (gel permeation chromatography) was 63,000 as a weight average molecular weight.

Polymerization Example 2

Example Containing 5 mol % of the Novel Amide Group-Containing Siloxane Diamine Compound of the Formula (1) in the Total Diamine Components A novel polyimide compound having an amide group was synthesized by carrying out the same operations as in Polymerization Example 1, except for using 4,099.8 g (3.04 mol) of the siloxane diamine compound (X-22-9409, Shin-Etsu Chemical Co. Ltd.), 1,907.0 g (5.32 mol) of the 3,3',4,4'-diphenylsulfone tetracarboxylic dianhydride (DSDA, New Japan Chemical Co., Ltd., 99.70% purity), 443.7 g (270.5 mmol, 97.10% purity) of the novel amide group-containing siloxane diamine compound obtained in Reference Example 1, and 549.5 g (1.96 mol) of the 3,3'-diamino-4,4'-dihydroxydiphenylsulfone (BSDA, Konishi Chemical Ind. Co., Ltd., 99.70% purity). The actually-measured solid content of the obtained polyimide was 47.4%. Furthermore, the molecular weight in terms of polystyrene by GPC (gel permeation chromatography) was 57,000 as a weight average molecular weight.

Polymerization Example 3

(Example Containing 10 mol % of the Novel Amide Group-Containing Siloxane Diamine Compound of the Formula (1) in the Total Diamine Components A novel polyimide compound having an amide group was synthesized by carrying out the same operations as in Polymerization Example 1, except for using 3,665.3 g (2.72 mol) of the siloxane diamine compound (X-22-9409, Shin-Etsu Chemical Co. Ltd.), 1,895.1 g (5.29 mol) of the 3,3',4,4'-diphenylsulfone tetracarboxylic dianhydride (DSDA, New Japan Chemical Co., Ltd., 99.70% purity), 881.9 g (537.7 mmol, 97.10% purity) of the novel amide group-containing siloxane diamine compound obtained in Reference Example 1, and 557.8 g (1.99 mol) of the 3,3'-diamino-4,4'-dihydroxydiphenylsulfone (BSDA, Konishi Chemical Ind. Co., Ltd., 99.70% purity). The actually-measured solid content of the obtained polyimide was 47.7%. Furthermore, the molecular weight in terms of polystyrene by GPC (gel permeation chromatography) was 77,000 as a weight average molecular weight.

Polymerization Example 4

Example not Containing the Novel Amide Group-Containing Siloxane Diamine Compound of the Formula (1))

A polyimide compound was synthesized by carrying out the same operations as in Polymerization Example 1, except for using 4550.2 g (3.37 mol) of the siloxane diamine compound (X-22-9409, Shin-Etsu Chemical Co. Ltd.), 1,914.5 g (5.34 mol) of the 3,3',4,4'-diphenylsulfone tetracarboxylic dianhydride (DSDA, New Japan Chemical Co., Ltd., 99.70% purity), and 535.3 g (1.91 mol) of the 3,3'-diamino-4,4'-dihydroxydiphenylsulfone (BSDA, Konishi Chemical Ind. Co., Ltd., 99.70% purity), and not using the novel amide group-containing siloxane diamine compound obtained in Reference Example 1. The actually-measured solid content of the obtained polyimide was 47.3%. Furthermore, the molecular weight in terms of polystyrene by GPC (gel permeation chromatography) was 65,000 as a weight average molecular weight.

Polymerization Example 5

Example Containing 1 mol % of the Novel Amide Group-Containing Siloxane Diamine Compound of the Formula (1) in the Total Diamine Components A novel polyimide compound having an amide group was synthesized by carrying out the same operations as in Polymerization Example 1, except for using 4289.6 g (3.14 mol) of the siloxane diamine compound (X-22-9409, Shin-Etsu Chemical Co. Ltd.), 1,988.4 g (5.62 mol) of the 3,3',4,4'-diphenylsulfone tetracarboxylic dianhydride (DSDA, New Japan Chemical Co., Ltd., 99.70% purity), 90.5 g (54.8 mmol) of the novel amide group-containing siloxane diamine compound obtained in Reference Example 1, and 631.5 g (2.25 mol) of the 3,3'-diamino-4,4'-dihydroxydiphenylsulfone (BSDA, Konishi Chemical Ind. Co., Ltd., 99.70% purity). The actually-measured solid content of the obtained polyimide was 49.50%. Furthermore, the molecular weight in terms of polystyrene by GPC (gel permeation chromatography) was 69,000 as a weight average molecular weight.

Examples 1 to 27 and Comparative Example 1

To 100 parts by mass of one of the polyimide compounds of Examples 1 to 5 was charged, in the respective blend amounts shown in Table 1, diazonaphthoquinone (4NT-300, Toyo Gosei Co., Ltd.) as a photosensitizing agent, a bis-F epoxy resin (jER 807, Japan Epoxy Resins Co., Ltd.) and tetraglycidyl diaminodiphenyl methane (jER 604, Japan Epoxy Resins Co., Ltd.) as crosslinking agents, an oxazine compound (6,6'-(1-methylidyne)bis[3,4-dihydro-3-phenyl-2H-1,3-benzoxazinel) (BF-BXZ, Konishi Chemical Ind. Co., Ltd.) as a crosslinking agent, and a metal deactivator (CDA-10, ADEKA Corporation). The resultant mixture was mixed until it was uniform to prepare a polyimide resin composition. The obtained polyimide resin composition was, as described below, subjected to test evaluations for developability, electroless Ni/Au plating resistance, curl properties, and flame retardance. The obtained results are shown in Tables 1 and 2.

<Developability>

The polyimide resin composition was coated on one side of a copper foil of about 0.3 μm which had been subjected in advance to a chemical polishing treatment so that the dry thickness would be 10 μm. A test piece A was produced by drying the coated composition for 10 minutes at 80° C. to form a polyimide resin layer on one side of the copper foil. The polyimide resin layer of the obtained test piece A was irradiated via an exposure mask having a given positive pattern with a cumulative amount of light being 2,500 mJ/cm$^2$ using an ultra high pressure mercury lamp (three-wire combination of a g wire, an h wire, and an i wire). Subsequently, the test piece A was dipped in a 3% aqueous sodium hydroxide solution heated at 40° C. and then dipped for 2 minutes in warm water heated at 40° C. to carry out alkali development. Furthermore, the test piece A was neutralized by dipping it in a 10% aqueous sulfuric acid solution, then thoroughly washed with distilled water, and dried to complete the series of development processes.

If the dipping time in the 3% aqueous sodium hydroxide solution is 60 seconds or less, alkali developability can be evaluated as being at a practical level.

Developability Evaluation Criteria

A: Development time in 3% aqueous sodium hydroxide solution (40° C.) is 60 seconds or less.

B: Development time in 3% aqueous sodium hydroxide solution (40° C.) exceeds 60 seconds.

<Curl Properties>

The polyimide resin composition was coated on a flat 25 μm-thick polyimide film (Upilex 25S, Ube Industries Ltd.) and dried at 80° C. for 10 minutes so that the dry thickness would be 10 μm (single-side coated). A test piece B was obtained by heating the coated product for 1 hour at 200° C. in a nitrogen atmosphere to complete crosslinking of the polyimide resin layer (post-baking). The obtained test piece B was cut into a 10 cm-square, and placed on a flat plate so that the film-forming face faced the ceiling. The lift of the four corners was measured, and the average value thereof was calculated. If this average value is less than 10 mm, the curl properties can be evaluated as being at a practical level.

Curl Properties Evaluation Criteria

AA: Average value of less than 2 mm

A: Average value of 2 mm or more to less than 10 mm

B: Average value of 10 mm or more, but test piece B is note curled into a cylindrical shape.

C: Test piece B is curled into a cylindrical shape.

<Electroless Ni/Au Plating Resistance>

The test piece A used in the developability test was heated for 1 hour at 200° C. in a nitrogen atmosphere to complete crosslinking of the polyimide resin layer (post-baking). Next, an electroless nickel plating treatment (used plating solution: NPR-4, Uyemura & Co., Ltd.) was carried out, which was then followed by carrying out an electroless gold plating treatment (used plating solution: TKK-51, Uyemura & Co., Ltd.). If the discoloration of the polyimide resin layer around the conductor aperture of test piece A after the electroless Ni/Au plating treatment is less than 50 μm from the edge, the electroless Ni/Au plating resistance can be evaluated as being at a practical level.

Electroless Ni/Au Plating Resistance Evaluation Criteria

AA: No discoloration of aperture edge can be confirmed.

A: Discoloration of aperture edge is 20 μm or more to less than 50 μm.

C: Discoloration of aperture edge is 50 μm or more.

<Flame Retardance>

The polyimide resin composition was coated on both sides of a flat 25 μm-thick polyimide film (Upilex 25S, Ube Industries Ltd.) so that the respective dry thicknesses would be 10 μm, and then dried at 80° C. for 10 minutes. A test piece C was obtained by heating the dried product for 1 hour at 200° C. in a nitrogen atmosphere to complete crosslinking of the polyimide resin layer (post-baking). The obtained test piece C was tested based on the UL-94-VTM standard, and evaluated according to the following criteria.

Flame Retardance Evaluation Criteria

A: UL-94-VTM is satisfied.

C: UL-94-VTM is not satisfied.

TABLE 1

| | | | Comparative Example | Example | | | | | |
|---|---|---|---|---|---|---|---|---|---|
| | | | 1 | 1 | 2 | 3 | 4 | 5 | 6 |
| | Polyimide Compound (100 parts by mass) | | PE4 | PE1 | PE1 | PE1 | PE1 | PE1 | PE1 |
| Composition | Acid Anhydride | DSDA | 101 | 101 | 101 | 101 | 101 | 101 | 101 |
| | Diamine | X-22-9409 | 63.9 | 62.7 | 62.7 | 62.7 | 62.7 | 62.7 | 62.7 |
| | | BSDA | 36.1 | 36.3 | 36.3 | 36.3 | 36.3 | 36.3 | 36.3 |
| | | Reference Example 1 | — | 1 | 1 | 1 | 1 | 1 | 1 |
| Photosensitizing Agent | 4NT-300 (parts by mass) | | 15 | 15 | 15 | 15 | 15 | 15 | 15 |
| Metal Deactivator | CDA-10 (parts by mass) | | 0.3 | 0.3 | 0.3 | 0.3 | 0.3 | 0.3 | 0.3 |
| Crosslinking Agent | jER807 (parts by mass) | | — | — | 0.5 | 1 | 2 | — | — |
| Crosslinking Agent | jER604 (parts by mass) | | — | — | — | — | — | — | — |
| Crosslinking Agent | BF-BXZ (parts by mass) | | — | — | — | — | — | 5 | 10 |
| Evaluation Result | Developing Time | | A | A | A | A | A | A | A |
| | Curl Properties | | AA | AA | AA | A | A | A | B |
| | Electroless Ni/Au Plating Resistance | | C | A | A | A | A | AA | AA |
| | Flame Retardance UL-94-VTM-0 | | A | A | A | A | A | A | A |

| | | | Example | | | | | | |
|---|---|---|---|---|---|---|---|---|---|
| | | | 7 | 8 | 9 | 10 | 11 | 12 | 13 |
| | Polyimide Compound (100 parts by mass) | | PE1 | PE1 | PE2 | PE3 | PE1 | PE1 | PE2 |
| Composition | Acid Anhydride | DSDA | 101 | 101 | 101 | 101 | 101 | 101 | 101 |
| | Diamine | X-22-9409 | 62.7 | 62.7 | 57.8 | 52.0 | 62.7 | 62.7 | 57.8 |
| | | BSDA | 36.3 | 36.3 | 37.2 | 38 | 36.3 | 36.3 | 37.2 |

TABLE 1-continued

|  |  |  |  |  |  |  |  |  |
|---|---|---|---|---|---|---|---|---|
|  | Reference Example 1 | 1 | 1 | 5 | 10 | 1 | 1 | 5 |
| Photosensitizing Agent | 4NT-300 (parts by mass) | 15 | 15 | 15 | 15 | 12 | 12 | 12 |
| Metal Deactivator | CDA-10 (parts by mass) | 0.3 | 0.3 | 0.3 | 0.3 | 0.3 | 0.3 | 0.3 |
| Crosslinking Agent | jER807 (parts by mass) | 2 | — | 2 | 2 | 2 | — | 2 |
| Crosslinking Agent | jER604 (parts by mass) | — | 2 | — | — | — | 2 | — |
| Crosslinking Agent | BF-BXZ (parts by mass) | 5 | 5 | 5 | 5 | 5 | 5 | 5 |
| Evaluation Result | Developing Time | A | A | A | A | A | A | A |
|  | Curl Properties | A | A | B | B | A | A | A |
|  | Electroless Ni/Au Plating Resistance | AA | AA | AA | AA | AA | AA | AA |
|  | Flame Retardance UL-94-VTM-0 | A | A | A | A | A | A | A |

PE: Polymerization Example

TABLE 2

|  |  | Example |  |  |  |  |  |  |  |  |  |  |  |  |  |
|---|---|---|---|---|---|---|---|---|---|---|---|---|---|---|---|
|  |  | 14 | 15 | 16 | 17 | 18 | 19 | 20 | 21 | 22 | 23 | 24 | 25 | 26 | 27 |
| Polyimide Compound (100 parts by mass) |  | PE3 | PE1 | PE1 | PE2 | PE3 | PE5 | PE5 | PE5 | PE5 | PE5 | PE5 | PE5 | PE5 | PE5 |
| Composition | Acid Anhydride DSDA | 101 | 101 | 101 | 101 | 101 | 101 | 101 | 101 | 101 | 101 | 101 | 101 | 101 | 101 |
|  | Diamine X-22-9409 | 52 | 62.7 | 62.7 | 57.8 | 52.0 | 58 | 58 | 58 | 58 | 58 | 58 | 58 | 58 | 58 |
|  | BSDA | 38 | 36.3 | 36.3 | 37.2 | 38 | 41 | 41 | 41 | 41 | 41 | 41 | 41 | 41 | 41 |
|  | Reference Example 1 | 10 | 1 | 1 | 5 | 10 | 1 | 1 | 1 | 1 | 1 | 1 | 1 | 1 | 1 |
| Photosensitizing Agent | 4NT-300 (parts by mass) | 12 | 10 | 10 | 10 | 10 | 10 | 10 | 10 | 10 | 10 | 10 | 10 | 10 | 10 |
| Metal Deactivator | CDA-10 (parts by mass) | 0.3 | 0.3 | 0.3 | 0.3 | 0.3 | 0.3 | 0.3 | 0.3 | 0.3 | 0.3 | 0.3 | 0.3 | 0.3 | 0.3 |
| Crosslinking Agent | jER807 (parts by mass) | 2 | 2 | — | 2 | 2 | — | 0.5 | 1 | — | 2 | — | — | 2 | — |
| Crosslinking Agent | jER604 (parts by mass) | — | — | 2 | — | — | — | — | — | 1 | — | — | — | — | 2 |
| Crosslinking Agent | BF-BXZ (parts by mass) | 5 | 5 | 5 | 5 | 5 | — | — | — | — | — | 5 | 10 | 5 | 5 |
| Evaluation Result | Developing Time | A | A | A | A | A | A | A | A | A | A | A | A | A | A |
|  | Curl Properties | B | A | A | A | B | AA | A | A | A | A | A | B | A | A |
|  | Electroless Ni/Au Plating Resistance | AA | AA | AA | AA | AA | A | A | A | A | A | AA | AA | AA | AA |
|  | Flame Retardance UL-94-VTM-0 | A | A | A | A | A | A | A | A | A | A | A | A | A | A |

PE: Polymerization Example

The polyimide resin composition of Comparative Example 1 did not use the novel polyimide resin of the present invention, and thus had problems concerning its electroless Ni/Au plating resistance. In contrast, none of the polyimide resin compositions of Examples 1 to 15 were evaluated with a "C" concerning any of the evaluation items.

From the results of Examples 6 and 25, it can be seen that the curl properties tend to deteriorate if the blended amount of the oxazine crosslinking agent is too much. Furthermore, from the results of Examples 9, 10, 14, and 18, it can be seen that the curl properties tend to deteriorate even if the ratio of the novel amide group-containing siloxane diamine compound of Reference Example 1 is too large in the polyimide resin of the present invention.

INDUSTRIAL APPLICABILITY

In the novel polyimide resin composition according to the present invention, the elastic modulus of the polyimide resin can be reduced, since the novel amide group-containing siloxane diamine compound having a siloxane unit is an essential diamine component. Furthermore, because this novel amide group-containing siloxane diamine compound has an amide bond in the molecule, adhesion of the polyimide resin to a conductor part, such as the copper of a wiring board, can be improved. In addition, since the amide group undergoes an addition reaction or an insertion reaction with an epoxy group, the introduction of a reaction group for forming a crosslinking point in the polyimide resin after polyimidization is unnecessary. A novel photosensitive polyimide resin composition containing such a polyimide resin according to the present invention can confer a comparatively low elastic modulus and good electroless plating resistance to a film which is formed from this photosensitive polyimide resin composition. Therefore, a wiring board produced utilizing the photosensitive polyimide resin composition does not warp much even if it is a flexible board. Furthermore, discoloration of the conductor and rising of the ends of the polyimide resin composition layer due to the plating can be suppressed. Moreover, flame retardance is excellent, as there are many aromatic rings in the molecule. Therefore, the photosensitive polyimide resin composition according to the present invention is useful as a photosensitive dry film resist or a photosensitive cover film for electronic parts.

The invention claimed is:

1. A photosensitive polyimide resin composition comprising:
   a polyimide resin; and
   a photosensitizing agent in an amount of 5 to 30 parts by mass with respect to 100 parts by mass of the polyimide resin,
   wherein the polyimide resin is formed by imidization of:
   a diamine component including an amide group-containing siloxane diamine compound represented by the following formula (1), a siloxane diamine compound represented by the following formula (2) in an amount of 40 to 90 mol %, and a 3.3'-diamino-4.4'-dihydroxydiphenylsulfone in an amount of 20 to 50 mol %, and
   an acid dianhydride component including at least one 3,3',4,4'-diphenylsulfone tetracarboxylic dianhydride,

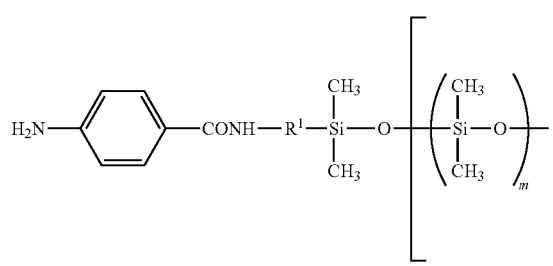

(1)

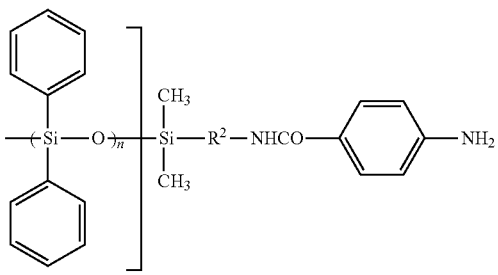

(2)

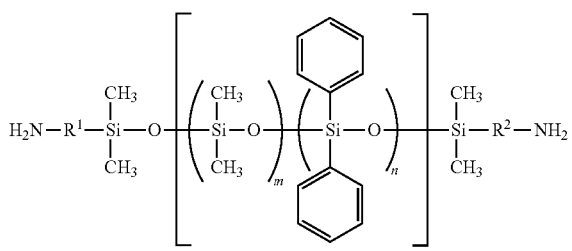

where in the formulas (1) and (2), $R^1$ and $R^2$ are each independently an optionally substituted alkylene group, m denotes an integer of 1 to 30, and n denotes an integer of 0 to 20.

2. The photosensitive polyimide resin composition according to claim 1, further comprising a crosslinking agent.

3. The photosensitive polyimide resin composition according to claim 2, wherein the crosslinking agent is an epoxy.

4. The photosensitive polyimide resin composition according to claim 2, wherein the crosslinking agent is an oxazine.

5. A wiring board having a polyimide resin layer, the polyimide resin layer being a film of the photosensitive polyimide resin composition according to claim 1.

* * * * *